US008160838B2

(12) United States Patent
Ramin et al.

(10) Patent No.: US 8,160,838 B2
(45) Date of Patent: Apr. 17, 2012

(54) APPARATUS AND METHOD FOR VISUALIZING ENVIRONMENTAL CONDITIONS IN A DATA CENTER USING WIRELESS SENSOR NETWORKS

(75) Inventors: Yann Ramin, Folsom, CA (US); Raju Pandey, Davis, CA (US)

(73) Assignee: SynapSense Corporation, Folsom, CA (US)

( * ) Notice: Subject to any disclaimer, the term of this patent is extended or adjusted under 35 U.S.C. 154(b) by 354 days.

(21) Appl. No.: 12/387,356

(22) Filed: Apr. 30, 2009

(65) Prior Publication Data

US 2010/0280796 A1    Nov. 4, 2010

(51) Int. Cl.
*H04B 17/00* (2006.01)
*G06F 17/40* (2006.01)

(52) U.S. Cl. ............ 702/188; 702/1; 702/127; 455/66.1; 455/67.11

(58) Field of Classification Search .................. 702/188, 702/1, 127, 130, 132
See application file for complete search history.

(56) References Cited

U.S. PATENT DOCUMENTS

| | | | |
|---|---|---|---|
| 5,379,290 A | 1/1995 | Kleijne | |
| 5,515,369 A | 5/1996 | Flammer, III | |
| 5,896,412 A | 4/1999 | Levanon | |
| 6,208,247 B1 | 3/2001 | Agre | |
| 6,404,756 B1 | 6/2002 | Whitehill | |
| 6,442,596 B1 | 8/2002 | Dyer | |
| 6,480,497 B1 | 11/2002 | Flammer, III | |
| 6,590,928 B1 | 7/2003 | Haartsen | |
| 6,735,630 B1 | 5/2004 | Gelvin | |
| 6,807,165 B2 | 10/2004 | Belcea | |
| 6,850,502 B1 | 2/2005 | Kagan | |
| 6,856,591 B1 | 2/2005 | Ma et al. | |
| 6,859,831 B1 | 2/2005 | Gelvin | |
| 7,010,392 B2 | 3/2006 | Bash | |
| 7,020,701 B1 | 3/2006 | Gelvin | |
| 7,031,329 B2 | 4/2006 | Lipsanen | |
| 7,031,870 B2 * | 4/2006 | Sharma et al. ................ 702/130 |
| 7,086,603 B2 | 8/2006 | Bash | |
| 7,176,808 B1 | 2/2007 | Broad | |
| 7,180,915 B2 | 2/2007 | Beyer | |

(Continued)

FOREIGN PATENT DOCUMENTS

DE    202006019810    5/2007

(Continued)

OTHER PUBLICATIONS

Kanzaki, Akimitsu et al.; Dynamic TDMA Slot Assignments in Ad Hoc Networks; 17th Int'l Conference on Advanced Information Networking and Applications; Mar. 2003; pp. 330-335.

(Continued)

*Primary Examiner* — Hal Wachsman
(74) *Attorney, Agent, or Firm* — Salter IP Law; Jim H. Salter (57) ABSTRACT

Various embodiments provide an apparatus and method for visualizing environmental conditions in a data center using wireless sensor networks. An example embodiment includes: establishing communication with a plurality of networked environmental sensors deployed at particular points in one of a plurality of pre-defined layers for a facility; periodically obtaining measured environmental data values from each of the plurality of networked environmental sensors using a wireless sensor network; using the measured environmental data values at the particular points to extrapolate computed environmental data values at intermediate points in the facility; and using the measured environmental data values and the computed environmental data values to generate a visualization of environmental conditions in the facility.

18 Claims, 11 Drawing Sheets

U.S. PATENT DOCUMENTS

| | | | |
|---|---|---|---|
| 7,272,129 B2 | 9/2007 | Calcev | |
| 7,463,644 B2 | 12/2008 | Zhu | |
| 7,502,360 B2 | 3/2009 | Liu | |
| 7,680,092 B2 | 3/2010 | Van Laningham | |
| 7,739,073 B2 * | 6/2010 | Hamann et al. | 702/130 |
| 7,933,739 B2 * | 4/2011 | Brey et al. | 702/150 |
| 7,979,250 B2 * | 7/2011 | Archibald et al. | 703/5 |
| 2002/0073152 A1 | 6/2002 | Andrew | |
| 2003/0067892 A1 | 4/2003 | Beyer | |
| 2005/0024826 A1 * | 2/2005 | Bash et al. | 361/695 |
| 2005/0030968 A1 | 2/2005 | Rich et al. | |
| 2005/0074025 A1 | 4/2005 | Shao et al. | |
| 2005/0129051 A1 | 6/2005 | Zhu | |
| 2005/0173549 A1 | 8/2005 | Bash | |
| 2005/0201340 A1 | 9/2005 | Wang | |
| 2005/0213612 A1 | 9/2005 | Pister | |
| 2005/0239411 A1 | 10/2005 | Hazra | |
| 2006/0029060 A1 | 2/2006 | Pister | |
| 2006/0029061 A1 | 2/2006 | Pister | |
| 2006/0034191 A1 | 2/2006 | Sahinoglu | |
| 2006/0126501 A1 | 6/2006 | Ramaswamy | |
| 2006/0149408 A1 | 7/2006 | Speeter | |
| 2006/0161909 A1 | 7/2006 | Pandey | |
| 2006/0198346 A1 | 9/2006 | Liu | |
| 2006/0215581 A1 | 9/2006 | Castagnoli | |
| 2006/0215583 A1 | 9/2006 | Castagnoli | |
| 2006/0225446 A1 * | 10/2006 | Bash et al. | 62/178 |
| 2006/0268791 A1 | 11/2006 | Cheng | |
| 2006/0269028 A1 | 11/2006 | Bley | |
| 2007/0050523 A1 | 3/2007 | Emeott | |
| 2007/0116060 A1 | 5/2007 | Qu | |
| 2007/0208992 A1 | 9/2007 | Koren | |
| 2007/0211686 A1 | 9/2007 | Belcea | |
| 2007/0258508 A1 | 11/2007 | Werb | |
| 2008/0008138 A1 | 1/2008 | Pun | |
| 2008/0019265 A1 | 1/2008 | Alluisi et al. | |
| 2008/0019302 A1 | 1/2008 | Nagarajan | |
| 2008/0043707 A1 | 2/2008 | Ren | |
| 2008/0095222 A1 | 4/2008 | Van Laningham | |
| 2008/0151801 A1 | 6/2008 | Mizuta | |
| 2008/0269932 A1 * | 10/2008 | Chardon et al. | 700/98 |
| 2008/0298450 A1 | 12/2008 | Zhang | |
| 2009/0109992 A1 | 4/2009 | Lurie et al. | |

FOREIGN PATENT DOCUMENTS

| | | |
|---|---|---|
| JP | 2004-336779 | 11/2004 |
| JP | 2006-311549 | 11/2006 |
| WO | WO2005083953 | 9/2005 |
| WO | WO2007015962 | 6/2007 |
| WO | WO2008021278 | 7/2008 |
| WO | WO/2010/126469 A1 | 11/2010 |

OTHER PUBLICATIONS

Lee, Myung J. et al.; Emerging Standards for Wireless Mesh Technology; IEEE Wireless Communications; Apr. 2006; vol. 13; pp. 56-63.

Wei Li et al.; Dynamic TDMA Slot Assignment Protocol for Multihop Ad Hoc Networks; Int'l Conference on Communication Technology; Nov. 2006; pp. 1-4.

PCT Search Report, Nov. 1, 2011.

* cited by examiner

| ICON | DESCRIPTION |
| --- | --- |
| △ | Rack/Cabinet Monitoring with sub floor reference temperature |
| △ | Rack/Cabinet Monitoring (receives reference temperature from another device) |
| △R | Rack/Cabinet Monitoring located on right end of aisle (receives reference temperature from another device) |
| △L | Rack/Cabinet Monitoring located on left end of aisle (receives reference temperature from another device) |
| △ | Rack/Cabinet Monitoring (3 cold aisle sensors and 1 hot aisle sensor) |
| ☆ | Standalone Rack Reference T temperature |
| △ | Rack/Cabinet Monitoring with no sub floor reference temperature |
| △ | Rack/Cabinet Monitoring located on left end of aisle |
| △R | Rack/Cabinet Monitoring located on right end of aisle |
| ⬡ | Pressure Monitoring (Static Pressure Differential) |
| ○ | CRAC/CRAH Monitoring (Temperature and RH) |
| ∽ | Water Flow Monitoring |
| ◠ | Power Monitoring |

Fig. 6

| ICON | DESCRIPTION |
| --- | --- |
| ✚ | Pipe Temperature Monitoring (Temperature of chilled water) |
| □ | Synapsense Gateway Device |
| ◠ | Current Monitoring |
| ✚ | Leak Detector (Present or Absent) |
| ⊠ | Door Monitoring (Open or Closed) |
| ☆ | Standalone ThermaNode |
| ⬠ | LiveImaging ThermaNode |

APPARATUS AND METHOD FOR VISUALIZING ENVIRONMENTAL CONDITIONS IN A DATA CENTER USING WIRELESS SENSOR NETWORKS

TECHNICAL FIELD

The disclosed subject matter relates to the field of environmental monitoring and control, and more particularly to visualization of environmental conditions in data centers.

COPYRIGHT

A portion of the disclosure of this patent document contains material that is subject to copyright protection. The copyright owner has no objection to the facsimile reproduction of the patent document or the patent disclosure, as it appears in the Patent and Trademark Office patent files or records, but otherwise reserves all copyright rights whatsoever. The following notice applies to the software and data as described below and in the drawings that form a part of this document: Copyright 2008-2009 SynapSense Corporation, All Rights Reserved.

BACKGROUND

A data center can be modeled as rows of racks that house electronic systems, such as computing systems. The computing systems (such as computers, storage devices, networking devices, etc.) consume power for their operation. In addition, these computing systems disperse large amounts of heat during their operation. The computing systems can also affect the humidity, airflow, and other environmental conditions in the data center. In order to ensure proper operation of these systems, the computing systems need to be maintained within tight operating ranges of environmental conditions (e.g., temperature, pressure, humidity, and the like). The computing systems may need to be maintained within a desired temperature range, a desired humidity range, a desired air pressure range, and without the presence of moisture or fire. The failure to maintain such environmental conditions results in system failures.

Conventional data centers employ different forms of environmental control devices or cooling mechanisms to keep the computing systems within a safe temperature range. For example, in most data centers, cooling units, such as computer room air conditioning (A/C) or air handling units distribute cold air or cold liquid to different racks via aisles between the racks. The computing systems of the data center reside in these racks.

There is a significant energy cost associated with maintaining safe environmental conditions in a data center. Cold air and sometimes liquid coolant must be moved through the aisles, racks, and computing systems. In order to optimize this energy usage for controlling environmental conditions, the environmental control devices in the data center must precisely control the volume and temperature of the cooling air or liquid that must be pushed through the sub-plenum and racks of the data center. Unfortunately, many data centers operate by pushing too much cooling air or liquid at very low temperature, thereby incurring significant and unnecessary energy costs. Other data centers must cool an entire room to meet the environmental requirements for a single computing device, thereby wasting energy relative to the other computing devices in the data center.

In order to ensure that the computing systems are operating safely, cooling air or liquid needs to be supplied at the right volume and at the right temperature to the racks. Due to the variations in processing load, airflow characteristics, and other operational dynamics, the environmental conditions at the racks may vary significantly. The data center operators, therefore, need the ability to observe the environmental conditions at different points in a data center and identify locations that need attention. Conventional data centers cannot provide a view of the environmental conditions at various locations within the data center or facility.

U.S. Pat. No. 7,031,870 describes a method for evaluating one or more components in a data center, in which inlet and outlet temperatures of one or more heat dissipating devices are detected. In addition, the temperatures of air supplied by one or more computer room air conditioning (CRAC) units are also detected. Indices of air re-circulation for the one or more heat dissipating devices are calculated based upon the detected inlet temperatures, outlet temperatures and supplied air temperatures. The indices of air re-circulation are determined at various flow field settings of air delivered to the one or more heat dissipating devices and the one or more components are evaluated based upon changes in the indices of air re-circulation for the one or more heat dissipating devices at the various flow field settings.

Thus, an apparatus and method for visualizing environmental conditions in a data center using wireless sensor networks are needed.

DETAILED DESCRIPTION

In the following detailed description, a reference is made to the accompanying drawings that form a part hereof, and in which are shown, by way of illustration, specific embodiments in which the disclosed subject matter can be practiced. It is understood that other embodiments may be utilized and structural changes may be made without departing from the scope of the disclosed subject matter.

According to various example embodiments of the disclosed subject matter as described herein, there is provided an apparatus and method for visualing environmental conditions in a data center or facility using wireless sensor networks. A particular embodiment relates to a network of radio frequency (RF) devices (wireless nodes) that include one or more sensing devices configured to sense various environmental conditions. Then, using wireless data communications, the wireless nodes can communicate sensor information, environmental information, or network information with other nodes of the network or with a set of network controllers (e.g., gateways). The network and node configuration in a particular embodiment are described in more detail below.

The various example embodiments of the disclosed system and method include an adaptive system and method for providing operators with a visualization or view of environmental conditions in a data center or facility. The method involves deploying wireless sensor devices for collecting information at different locations and levels in the data center or facility, and then using the sensor location information along with the sensor environmental data to produce a color-coded map that precisely describes the environmental conditions of the data center or facility in a visualization or view. As described in more detail below, the various embodiments provide several advantages. These advantages include the following:

The system and method provide a very high level description of the environmental state of the data center, which can be used by the data center operator to quickly identify problem spots.

The system and method provide a high level view of how environmental state of the data center has changed over time. Such a view can help data center operators identify the environmental impact of changes. The system and method can use a local control scheme in which a controller uses local sensing information to control the operation of associated cooling units.

These and other advantages of the various embodiments described herein will be apparent to those of ordinary skill in the art upon reading this disclosure.

Wireless mesh network technology can be used for deploying sensors as nodes in a variety of different environments for monitoring diverse parameters such as, for example, temperature, pressure, humidity, airflow/fluid flow, the presence of moisture, the presence of smoke or fire, electrical current, power, air quality, air particle count, and the like. These types of networks can be denoted wireless sensor networks (WSN). Each sensor in a WSN is typically powered by a battery and therefore capable of operating in a wireless configuration. As described in more detail below, the sensors can constantly monitor the environment for various environmental conditions and may communicate with other nodes and/or a network controller or gateway.

Figure 1:
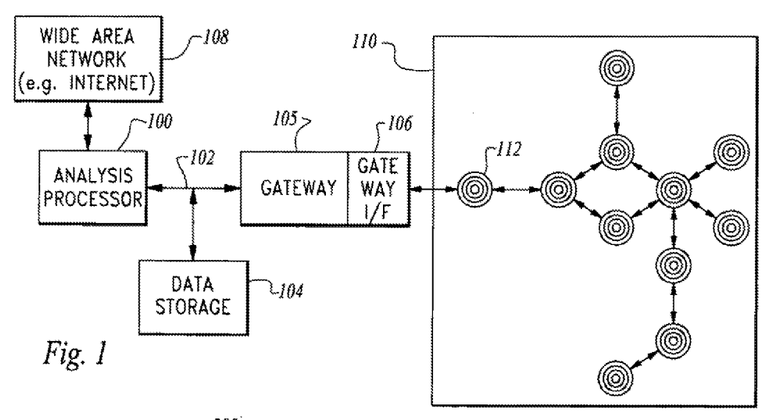
FIG. 1 illustrates a mesh network environment in which various embodiments can operate.

FIG. 1 illustrates a network environment of an example embodiment including a mesh network 110 of wireless sensors 112. Each of the sensors can be implemented as the combination of components illustrated in FIG. 2 and described in more detail below. Wireless sensor network (WSN) 110 includes a set of wireless sensors 112 (nodes), each in data communication with others of its proximate neighbor nodes. The nodes 112 can communicate using established data communication protocols, typically at the Media Access Control (MAC) Layer. The MAC Layer is one of two sub-layers that make up the Data Link Layer of the well-known OSI networking model. The MAC layer is responsible for moving data packets to and from the network interface of one node to another node across a shared channel. A node can be any vertex or intersection in the communication network 110. A node may be passive or intelligent. In a particular embodiment, a node is assumed to be an intelligent node configured to receive and analyzing information, taking certain actions as a result of received information, including the storing of received or processed information, modifying at least part of received information, and in some instances originating and retransmitting information. The details of a node of a particular embodiment are detailed in FIG. 2.

Referring still to FIG. 1, data packets or messages can be directed between any two nodes of the WSN 110 as each node 112 has a unique identifier. A data packet or message is a self-contained unit of transmitted information. Typically, a data packet has a header, a payload, and an optional trailer. A link is a path which originates at one node and terminates at one other node. A link or path between nodes may include multiple hops between a plurality of intermediate nodes prior to reaching a destination node. The transfer of messages between two nodes of WSN 110 in a unicast or broadcast transmission is termed a local communication.

Each of the nodes 112 of WSN 110 can also communicate with a gateway 105 via a gateway interface 106. The gateway 105 provides a connection between the WSN 110 and an analysis processor 100. Analysis processor 100 can be used to receive sensor data from any of the nodes 112 of WSN 110 via gateway 105 and to analyze the sensor data for aggregated environmental monitoring and control. Gateway 105 and analysis processor 100 can use a conventional data storage device 104 for data storage and retrieval. Analysis processor 100 can also include a connection to a wide area network 108, such as the Internet. In this manner, the gateway 105 and the WSN 110 can obtain access to the Internet.

The WSN 110 can be configured in any of a variety of ways. Nodes 112 can be added, removed, or moved within the array of nodes of WSN 110. Each of the nodes 112 include functionality to join or reconfigure themselves in the WSN 110 when a node is added or moved. As part of this functionality, each node 112 can discover its neighbor nodes and automatically negotiate and establish communication paths with those neighbors. A node can be in direct data communication with neighbors that are within the radio reception range of the node. Depending on the strength of the wireless transceivers (e.g., radios) within each node 112, the distance between neighbor nodes is variable. Given that in some applications the environment in which WSN 110 is being used may be subject to radio interference, it is possible that the wireless data communications between nodes may be disrupted. In these cases, each node can sense the loss of data communications with a neighbor and may reconfigure itself to use alternate data paths through other functioning nodes of WSN 110. As such, the WSN 110 is highly adaptable to changing conditions in the environment and in the configuration of the wireless network.

Figure 2:
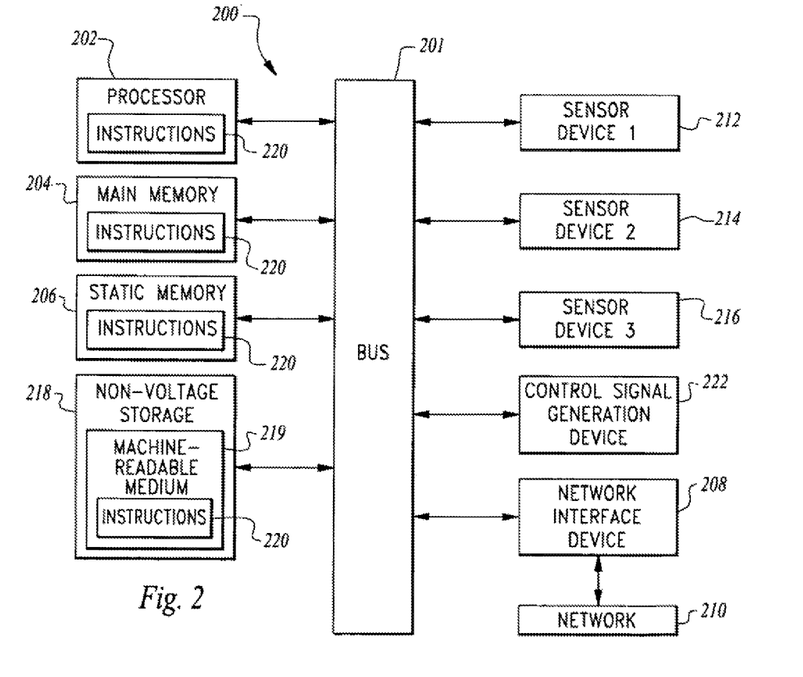
FIG. 2 illustrates an example embodiment of a node that can operate in a mesh network.

FIG. 2 shows a diagrammatic representation of a machine in the example form of a network node or sensor unit 200 within which a set of instructions, for causing the node to perform any one or more of the methodologies discussed herein, may be executed. In alternative embodiments, the node operates as a standalone device or may be connected (e.g., networked) to other machines. In a networked deployment, the node may operate in the capacity of a server or a client machine in client-server network environment, or as a peer machine in a peer-to-peer (or distributed) network environment, such as a mesh network. The node may be a computer, an intelligent sensor, a logic device, an application specific integrated circuit (ASIC), a field programmable gate array (FPGA), a hard-wired module, a network router, gateway, switch or bridge, or any machine configured to execute a set of instructions (sequential or otherwise) that specify actions to be taken by that machine. Further, while a single machine is illustrated in FIG. 2, the term "machine" or "node" shall also be taken to include any collection of machines that individually or jointly execute a set (or multiple sets) of instructions to perform any one or more of the methodologies discussed herein.

The example node 200 includes a processor 202 (e.g., a central processing unit (CPU)), a main memory 204 and optionally a static memory 206, which communicate with each other via a bus 201. The node 200 may further include one or more sensor devices 212, 214, and 216. These sensor devices can include temperature sensors, humidity sensors, air pressure sensors, air flow sensors, moisture detectors, carbon monoxide detectors, fire/smoke detectors, motion detectors, seismic detectors, electrical current sensors, power sensors, air quality sensors, air particle count sensors, magnetic anomaly sensors, and/or other types of sensors for detecting and measuring a desired environmental condition.

The node 200 may further include a non-volatile memory 218, a control signal generation device 222, and a network interface device 208 (e.g., a radio transceiver or wireless device configured to connect with a network). The non-volatile memory 218 includes a machine-readable medium 219 in which is stored one or more sets of instructions (e.g., software and data 220) embodying any one or more of the methodologies or functions described herein. The instructions 220 may also reside, completely or partially, within the main memory 204, the static memory 206, and/or within the processor 202 during execution thereof by the node 200. The main memory 204, static memory 206, and the processor 202 also may constitute machine-readable media. The software, instructions, and/or related data 220 may further be transmitted or received over a network 210 via the network interface device 208. The network interface device 208, in a wireless node configuration of one embodiment, may include a radio transceiver for sending and receiving data to/from network 210 using a wireless data transfer protocol, such as the family of 802.11 standards from IEEE. In this manner, node 200 can perform wireless data communications with other nodes of WSN 110. The control signal generation device 222 can be used to control the operation of an environmental management system, such as a heating/ventilating/air conditioning (HVAC) system, a fan, a heat pump, or other device or system that can alter the environmental conditions being monitored by sensors 212, 214, and 216.

Typically in wireless network systems, the wireless data transceivers (e.g., radios) in the network nodes consume the most electrical power and represent the largest drain on the node's battery power. As such, the radio should be turned off for most of the time to increase the battery lifetime of the nodes. In an example embodiment, all nodes of WSN 110 are time synchronized. Each node wakes up for a short period of time for radio communication with other nodes or the gateway. Then, the node's radio is shut off and the node sleeps until the next communication cycle.

Figure 3:
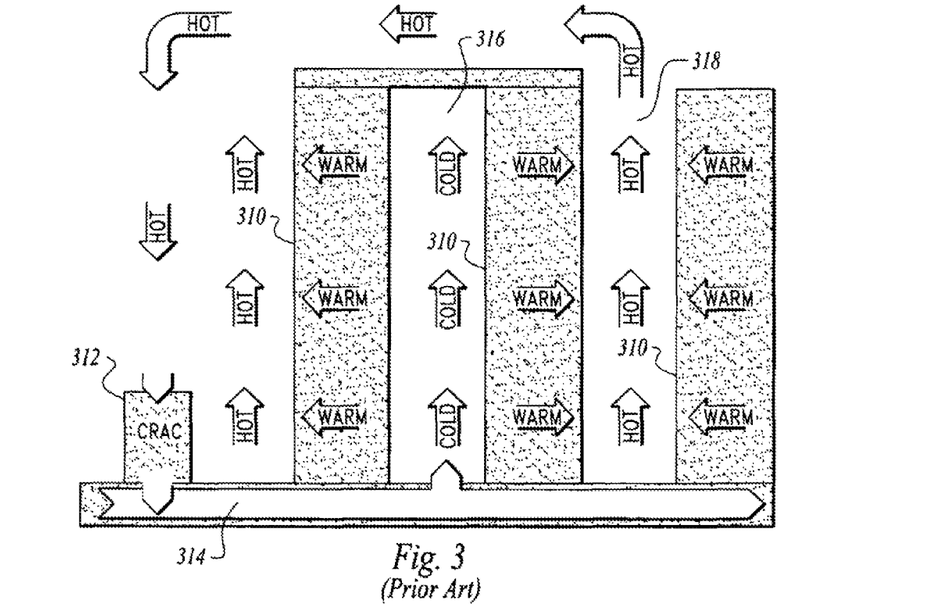
FIG. 3 illustrates an example of a prior art process for cooling racks in a data center.

FIG. 3 illustrates the organization of a conventional data center and the standard process for controlling the temperature in the center. As shown, the well-known data center configuration includes a set of racks 310 that support stacked sets of electronic equipment. Because the operating electronic equipment generates heat, it is necessary to cool this equipment with a computer room air conditioning (CRAC) unit 312 (also denoted herein as a computer room air handler—CRAH). The CRAC 312 generates cold air that is pumped through a space 314 under a raised floor into different aisles (e.g., aisle 316) between racks 310. The aisles (e.g., aisles 316 and 318) are organized into cold and hot aisles. Aisle 316 is a cold aisle. Aisle 318 is a hot aisle. In the cold aisles (e.g., aisle 316), the input side of the air inlets of the electronic equipment in racks 310 face the cold aisle (e.g., aisle 316). The cool air is pumped into the cold aisle 316. The cool air then moves through the air inlets of the electronic equipment in racks 310 keeping these systems cool. As the air moves through the racks 310, the air gains heat from the electronic equipment. The heated air exits the racks 310 and moves into the hot aisles (e.g., aisle 318). The heated air rises out of the hot aisles and eventually returns to the input side of the CRAC 312 where the heated air can be cooled and again cycled through racks 310.

Although the conventional data center air conditioning system illustrated in FIG. 3 and described above can monitor and control the temperature in a data center, the conventional system is not energy efficient. Further, the conventional system cannot distinguish between the cooling requirements for the different electronic devices in racks 310. For example, it is possible that some electronic systems in racks 310 may run hotter than other systems. Some systems may require a greater or lesser air flow rate. The conventional system is not sensitive to the individual environmental needs of each of the electronic devices in racks 310.

As described herein, an apparatus and method for visualizing environmental conditions in a data center using wireless sensor networks is disclosed. The apparatus and method in a particular embodiment include using a network of wireless sensors to monitor various environmental conditions in specific locations in a data center over time and to generate a visualization of the environmental conditions in the data center. In a particular embodiment, the generation of a visualization of the environmental conditions includes, developing a three-dimensional (3D) coordinate system for the data center, deploying sensors in the data center, and using sensor location and sensor environmental data to construct a map of the environmental conditions in the data center. The 3D coordinate system can be based on location information, a relative coordinate system, or a graphical user interface-based coordinate system. The 3D coordinate system provides a coordinate point in the 3D coordinate system for each sensor location. The data center can then be divided into 'n' planes that are parallel to the data center floor. The number 'n' depends on how sensing points (sensor locations) are located vertically in the data center. Each plane can contain a number of sensors. The lowest plane resides in the sub-plenum of the data center. A plane can be defined for each sensor and a location for the sensor on the defined plane can be determined. Once a desired 3D coordinate system and set of planes are defined, a set of wireless sensor devices can be deployed in the data center at locations consistent with the defined set of planes. A sample deployment of sensors in an example embodiment is described in more detail below.

Figure 4:
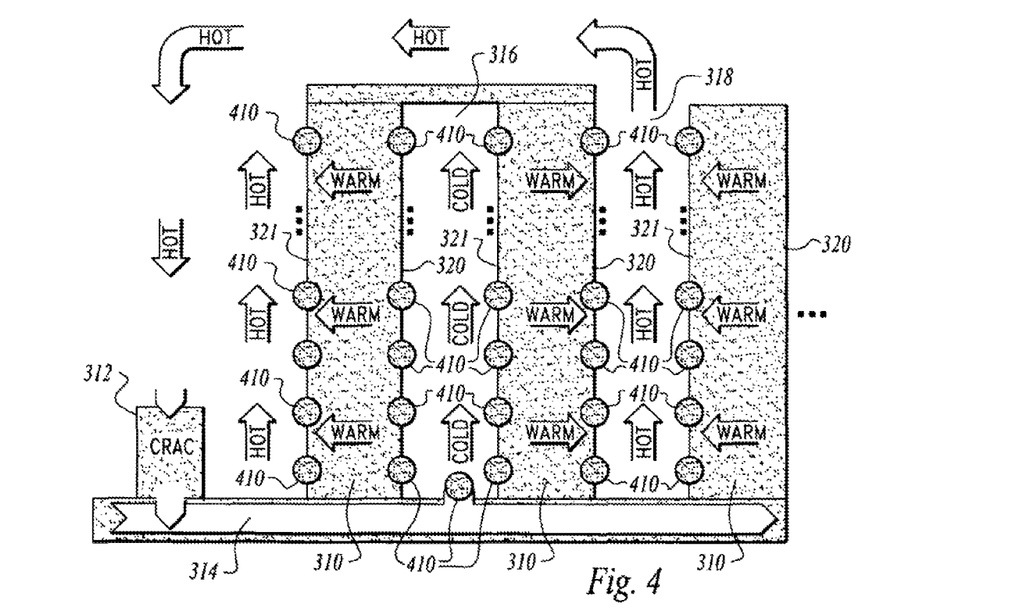
FIG. 4 illustrates a data center configuration of a particular embodiment that includes a set of racks that support stacked sets of electronic equipment and sensor devices deployed therein.

FIG. 4 illustrates a data center configuration of a particular embodiment that includes a set of racks 310 that support stacked sets of electronic equipment. In the illustrated example, wireless sensor devices 410 have been installed at various points on each side of each of racks 310. The wireless sensor devices 410 can be implemented as the devices illustrated in FIG. 2 and described above. As described above in connection with FIGS. 1 and 2, the wireless sensor devices 410 are wirelessly networked together in a network 110

(shown in FIG. 1) and in data communications with a gateway 105 and an analysis processor 100. Each of the sensors 410 can be configured to sense various environmental conditions, such as humidity, temperature, power, electrical current, airflow, air quality, air particle count, and the like. At a predetermined and configurable time interval, sensors 410 can measure the temperature and/or other environmental conditions at each sensor location and retain the environmental data measurements along with a timestamp associated with each environmental data measurement. Using the data network 110, the sensors 410 can transmit time-stamped environmental data along with a sensor identifier to the analysis processor 100 for processing. In this manner, the analysis processor 100 can collect the time-stamped environmental data from each of the sensors 410 installed in racks 310. It will be understood by those of ordinary skill in the art upon reading this patent disclosure that an arbitrary number of sensors 410 can be installed in the racks 310 in arbitrary positions within each rack of a particular data center. In general, the greater number of sensors 410 increases the ability for the system to detect more subtle changes in the environmental conditions within the data center as will be described in more detail below.

As illustrated in FIG. 4, a set of same or different kinds of sensors can be placed in rack 310 supporting electronic systems. Sensors 410 can be of a variety of types including devices for sensing humidity, temperature, power, electrical current, airflow, air quality, air particle count, and the like. Sensors 410 can be deployed both at the inlet (cool side) 320 and at the outlets (hot side) 321 of racks 310. The number of sensors at the cool side 320 and the hot side 321 can vary. Sensors can be mounted along the center of the racks 310 or along the edges. In a particular embodiment, power and current sensors can be deployed at the rack level (e.g., one sensor for the entire rack 310 having multiple electronic components therein) or at the individual system level (e.g., a separate sensor 410 for each electronic component in the rack 310). In the case of a single rack 310 sensor, each sensor 410 can measure the power or current (or other conditions) for the entire rack 310. In the case of one sensor 410 per electronic component, each sensor 410 can measure power or current (or other conditions) for a single electronic component. In this case, the sensor 410 can be placed next to or in proximity with the electronic component. The presence of a sensor 410 at a particular location denotes a plane at that level that intersects the sensor location.

As shown in FIG. 4, for raised floor type supply air delivery as is common in conventional data centers, pressure sensors can be deployed below the raised floor to measure the differential pressure between the sub-floor plenum 314 and room pressure. Pressure sensors can be placed under the raised floor and attached to the underside of tiles at ends of cold aisles, in hot aisles, and in cold aisles where solid vs. perforated tiles are available. For overhead supply air delivery, pressure sensors can be deployed to measure the differential pressure between the supply air duct and the room as measured in the cold aisles. Plenums 314 carry the cooling liquid/air from the cooling units 312 to the devices in the racks 310. As the cooling liquid/air flows from the cooling units 312 to the cold aisles 316, both the temperature and the pressure of the liquid/air changes. Pressure differential and temperature sensors can be deployed throughout the plenum 314 to record the temperature and pressure differential across the data center floor. The cooling units 312 receive hot air at their return vent, cool the hot air to a specified temperature, and supply the cooled liquid/air through the plenum 314. Wireless temperature sensors 410 can be deployed at both the return and supply vents.

Other temperature and humidity (or other type) sensors can also be deployed strategically in different parts of the data center. For example, sensors 410 can be deployed in places where there are no racks, cooling units, or other infrastructures. The presence of a sensor 410 at any particular location denotes a plane at that level that intersects the sensor location.

Figure 5:
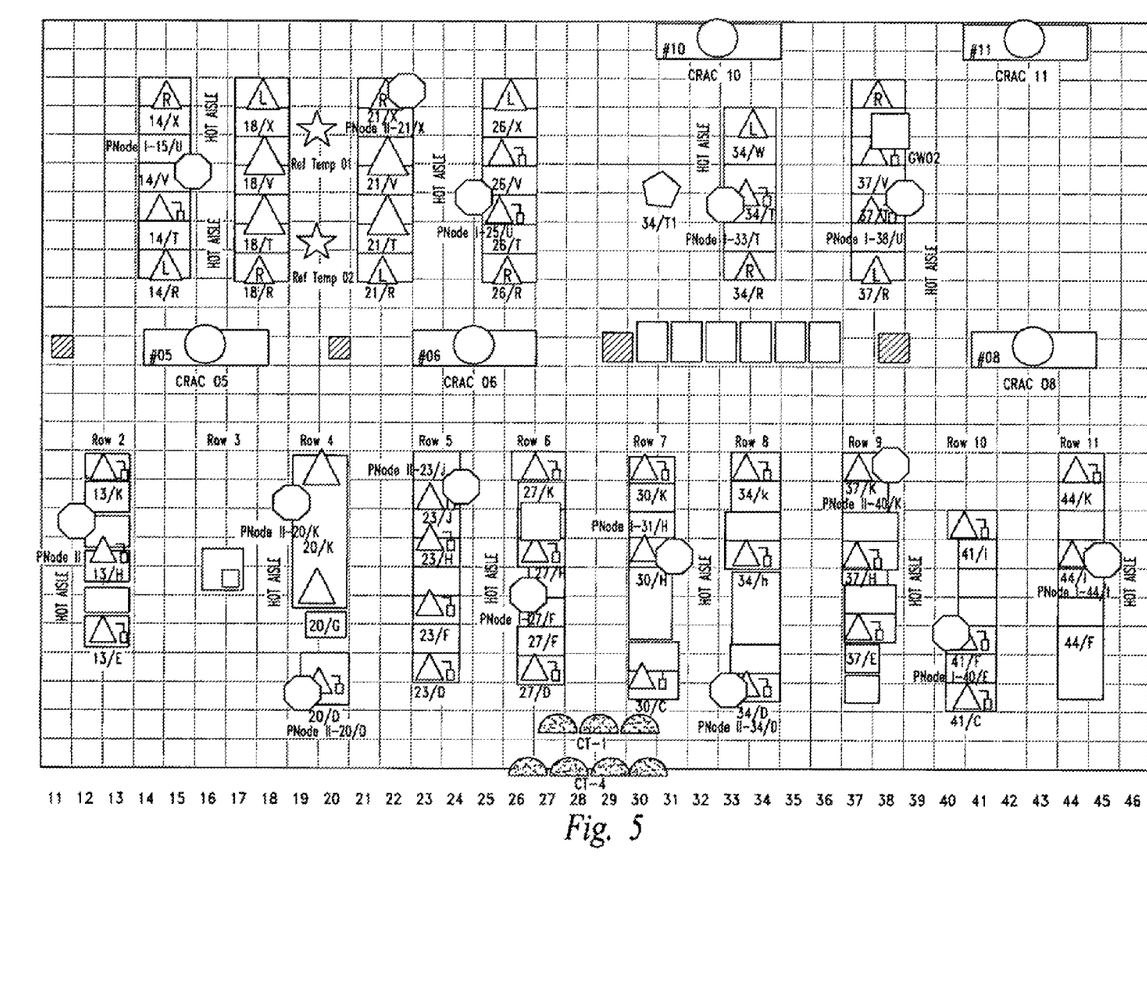
FIG. 5 illustrates a layout of an example data center in which an array of networked sensors has been deployed.

FIG. 5 illustrates a layout of an example data center in which an array of networked sensors has been deployed. A typical deployment can include an array of networked devices in a distributed network architecture. In a particular example embodiment, the system described herein can include several kinds of devices, including wireless sensors, gateways and routers, and controllers that are distributed in the data center. FIG. 5 illustrates such an example system. Gateways connect the wireless sensors 410 and sensor/controllers to an IP network, such as the Internet. Gateways have communication paths to all sensing and control devices in a particular system. Gateways can send commands, status information, or data center relevant information to the network devices. In a particular embodiment, an example system can include a centralized software system, called the Analysis and Control Unit (ACU), which stores all of the sensing, control, and status information that is forwarded to the gateways by the wireless sensors 410 and sensor/controllers. The ACU is primarily a repository of information and system-wide data processing for the system. The wireless sensors 410, sensor/controllers, and gateways (denoted generally herein as the network devices) cooperate to establish a mesh data communications network that provides connectivity among the network devices.

Figure 6:
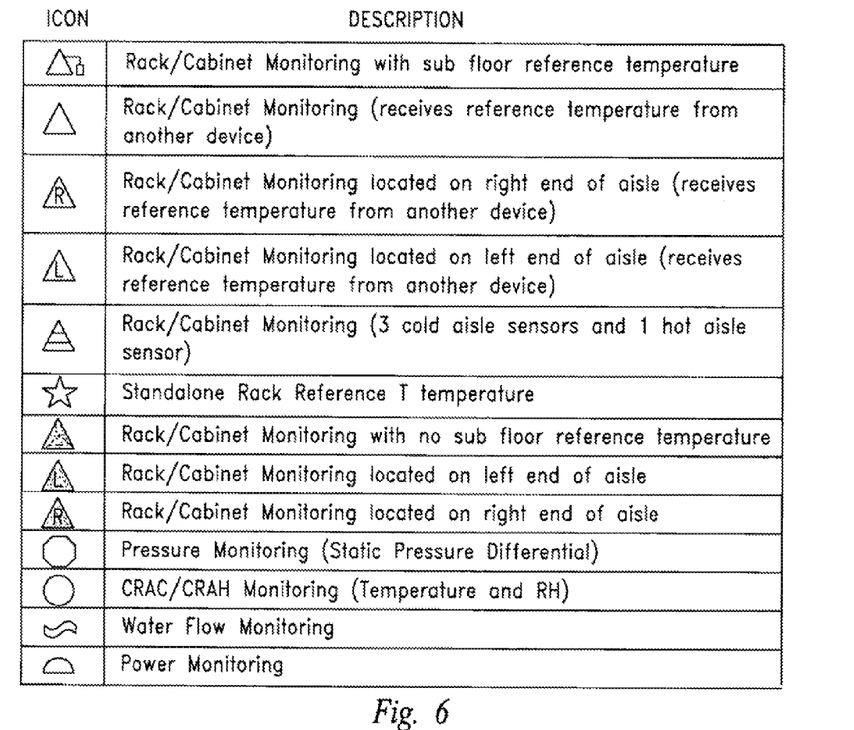
FIGS. 6 and 7 illustrate a legend that defines the types of devices deployed in the sample data center shown in FIG. 5.
Figure 7:
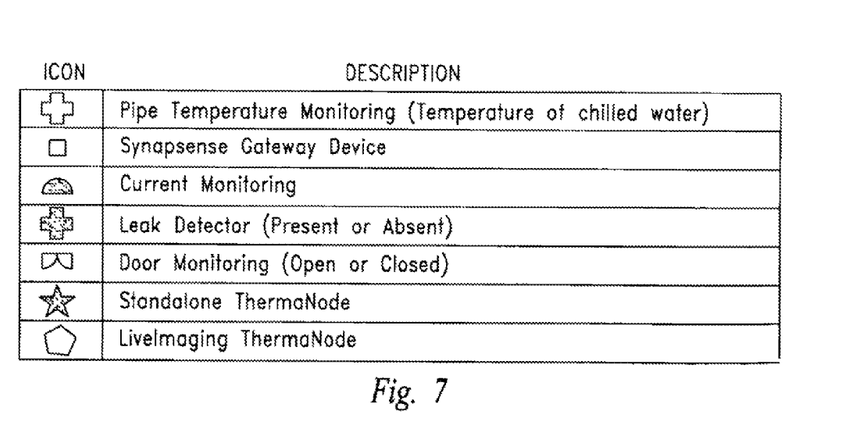

FIGS. 6-7 illustrate a legend that defines the types of network devices deployed in the sample data center shown in FIG. 5.

The various example embodiments of the disclosed system and method include a system and method for providing operators with a visualization or view of environmental conditions in a data center. The method involves deploying wireless sensor devices for collecting information at different locations and levels in the data center, and then using the sensor location information along with the sensor environmental data to produce a color-coded map that precisely describes the environmental conditions of the data center in a visualization or view. As described in more detail below, the various embodiments provide several advantages. These advantages include the following:

The system and method provide a very high level description of the environmental state of the data center, which can be used by the data center operator to quickly identify problem spots.

The system and method provide a high level view of how environmental state of the data center has changed over time. Such a view can help data center operators identify the environmental impact of changes. The system and method can use a local control scheme in which a controller uses local sensing information to control the operation of associated cooling units.

These and other advantages of the various embodiments described herein will be apparent to those of ordinary skill in the art upon reading this disclosure.

As part of the visualization functionality of a particular embodiment, thermal (environmental condition) maps can be generated to show the distribution of temperature across a data center. The temperature data (or other environmental data) to generate these thermal maps is obtained from the sensors 410 of the wireless sensor network deployed in the data center. In a particular embodiment, the thermal maps can be constructed in the following manner:

Establish communication with different temperature sensors (or other networked environmental sensors) deployed at particular points in one of the n layers or planes previously defined for a particular data center.

Every time period t, determine the measured temperature values (or other environmental data values) at each sensor point.

Use the measured temperature values (or other environmental data values) at the sensor points to extrapolate or interpolate the computed environmental data values at intermediate points in the data center. This creates a continuous thermal map showing the temperature (or other environmental condition) at different places in the data center.

In a particular embodiment, defined colors or shades of gray can be used to represent a particular value or range of values for a particular environmental condition. For example, in a visualization representing thermal (temperature) conditions in a data center, the color red (or dark gray in a gray scale) can be used to represent a temperature value of 100 degrees F. In this example, any of the sensors 410 of the wireless sensor network deployed in the data center that reports a temperature value of 100 degrees F. (+ or − a pre-defined amount) will be colored red or dark gray on the visualization thermal map. Similarly, other temperatures or temperature ranges can be associated with different colors or shades of gray and sensors reporting temperatures in those ranges will be represented on the visualization thermal map with the corresponding color or shade of gray. Thus, at each sensor location of the wireless sensor network deployed in the data center, a corresponding color or shade of gray can be used to represent a particular environmental condition at that location in the data center.

Given that sensors are deployed in the data center at discrete points, there will be other locations in the data center where no sensor is located. However, there will be two or more sensors located near (proximate to) every location in the data center. For these locations in the data center where no sensor is located, the data reported by the nearest two or more sensors can be used to interpolate the corresponding color or shade of gray for the locations in the data center where no sensor is located. For example, a particular location X in the data center may be located mid-way between two sensors, S1 and S2. Sensor S1 may be reporting a temperature value of 100 degrees F., which is represented by a color of red (or dark gray). Sensor S2 may be reporting a temperature value of 80 degrees F., which is represented by a color of yellow (or light gray). Given that the location X is located at the halfway point between S1 and S2, an interpolation can be performed to estimate the temperature value at location X. In this case, because the location X is located at the halfway point between S1 and S2, the temperature at location X is interpolated to be at the halfway point between the temperature of S1 and the temperature of S2. In this example, the temperature of location X is calculated to be 90 degrees F. (i.e. halfway between 80 degrees reported by S2 and 100 degrees reported by S1). Having computed or interpolated the temperature at location X based on the temperatures reported by S1 and S2, the corresponding color or shade of gray to represent the temperature at location X on the thermal map visualization can be determined. In this example, the temperature value at location X, calculated to be 90 degrees F., can be represented by a color of orange or medium gray (i.e., a color or shade of gray mid-way between red and yellow or mid-way between dark gray and light gray). It will be apparent to those of ordinary skill in the art that although a linear interpolation is used in the example described above, a non-linear interpolation model can similarly be used. In this manner, a corresponding color or shade of gray can be determined for every location in the data center using the sensor data provided by the sensors deployed in the data center at discrete points.

As described above, the sensors deployed in the data center can be deployed in vertical layers or planes that represent horizontal planar slices of the area in a particular data center. For example, a particular embodiment may deploy sensors at particular differentiated heights (e.g., heights above ground level) to obtain a view of the environmental conditions in a data center at a particular height or elevation above a defined zero point (typically ground level). In the example visualizations shown in FIGS. 8-11, visualizations are provided at pre-defined elevations (i.e. horizontal planar slices) defined as a top level, a middle level, a bottom level, and a sub-floor (plenum) level. In this manner, a visualization of the environmental conditions in a data center can be provided at differentiated vertical levels. When the interpolation calculation is performed as described above, the most proximate sensors in the same plane (at the same level) as a particular location being processed are used to determine the interpolated environmental condition at that location and at that level. The set of sensors deployed in a data center can thereby be grouped into sets or groups of sensors at a common level or in a common plane. A visualization can be generated as described above for the groups of sensors at a common level or in a common plane within the data center. Thus, the method and system of a particular example embodiment can be used to generate one or more visualizations of the environmental conditions in a data center using wireless sensor networks. Several example visualizations generated using the methods described herein are illustrated in FIGS. 8-13.

Figure 8:
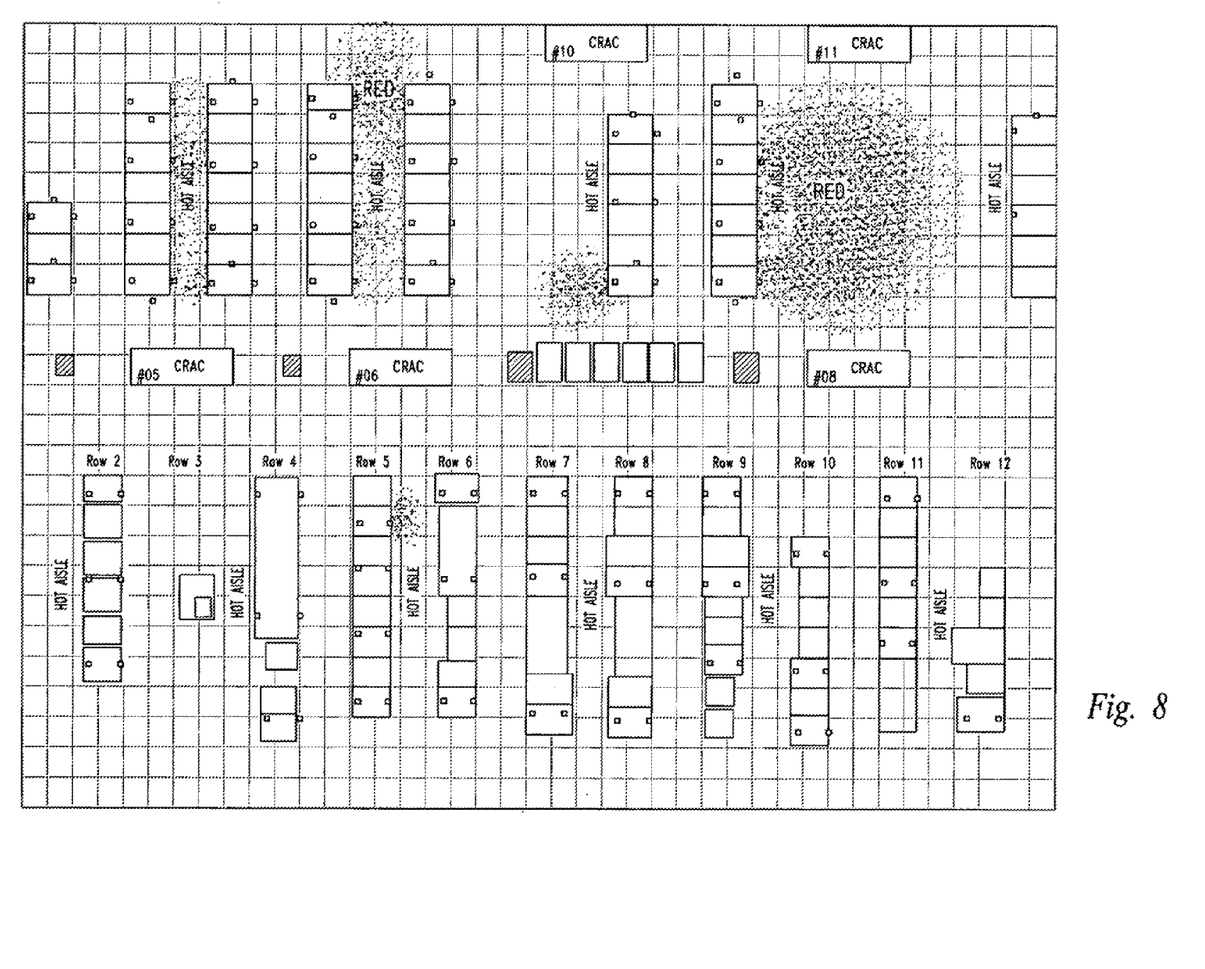
FIG. 8 illustrates an example embodiment of the visualization generated for a top level plane of temperature data for the example data center sensor deployment shown in FIG. 5.

FIG. 8 illustrates an example embodiment of the visualization generated for a top level plane of temperature data for the example data center sensor deployment shown in FIG. 5.

Figure 9:
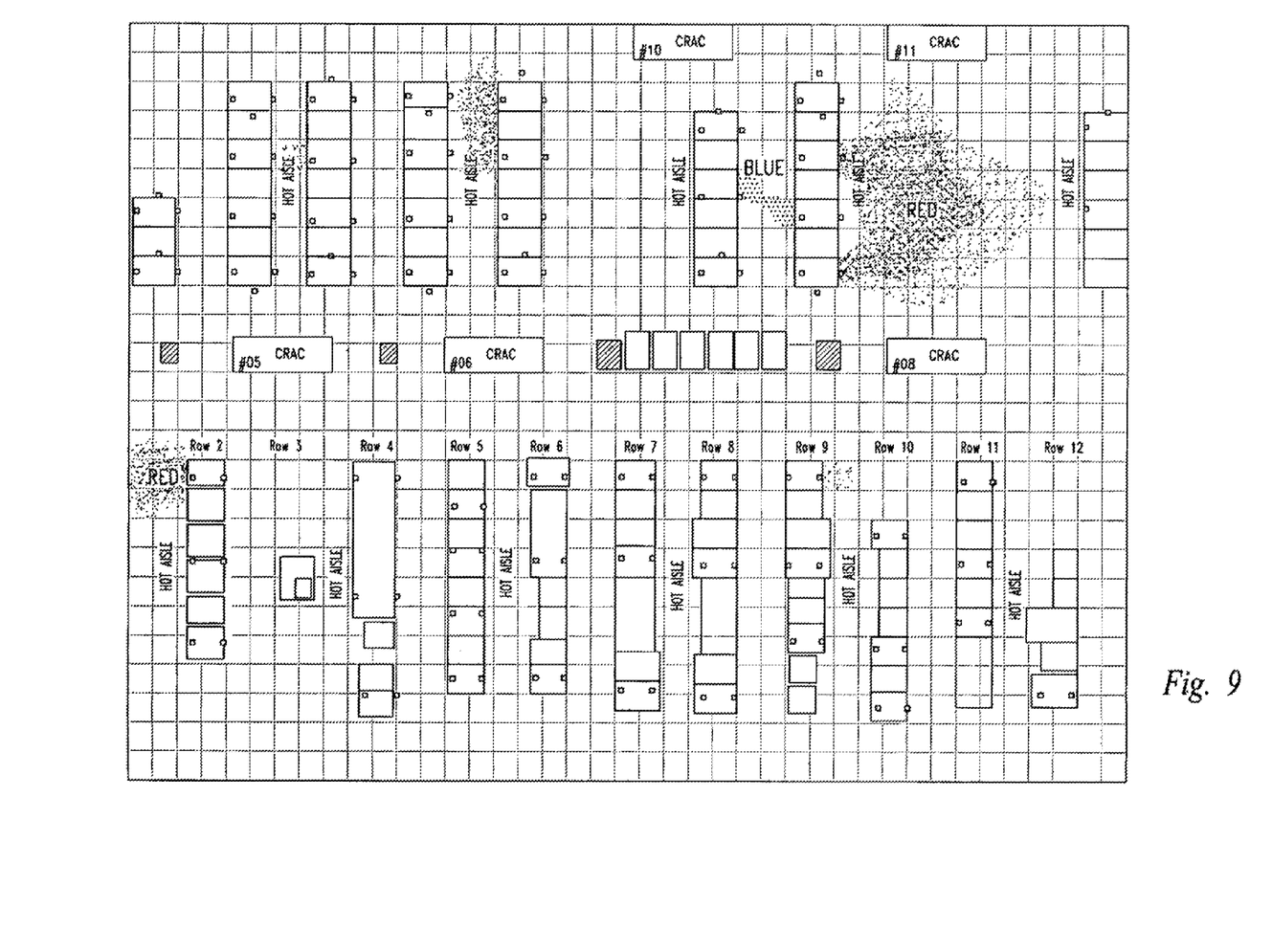
FIG. 9 illustrates an example embodiment of the visualization generated for a middle level plane of temperature data for the example data center sensor deployment shown in FIG. 5.

FIG. 9 illustrates an example embodiment of the visualization generated for a middle level plane of temperature data for the example data center sensor deployment shown in FIG. 5.

Figure 10:
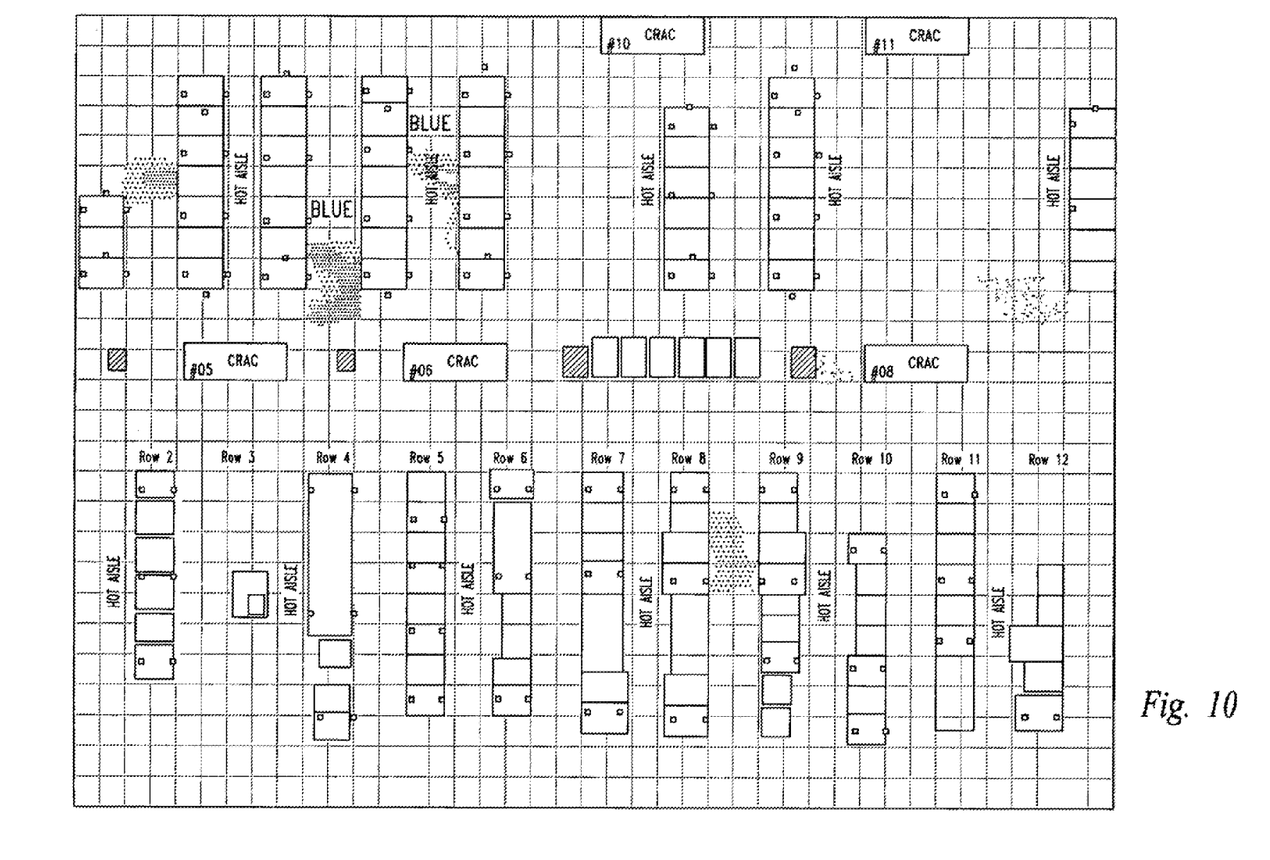
FIG. 10 illustrates an example embodiment of the visualization generated for a bottom level plane of temperature data for the example data center sensor deployment shown in FIG. 5.

FIG. 10 illustrates an example embodiment of the visualization generated for a bottom level plane of temperature data for the example data center sensor deployment shown in FIG. 5.

Figure 11:
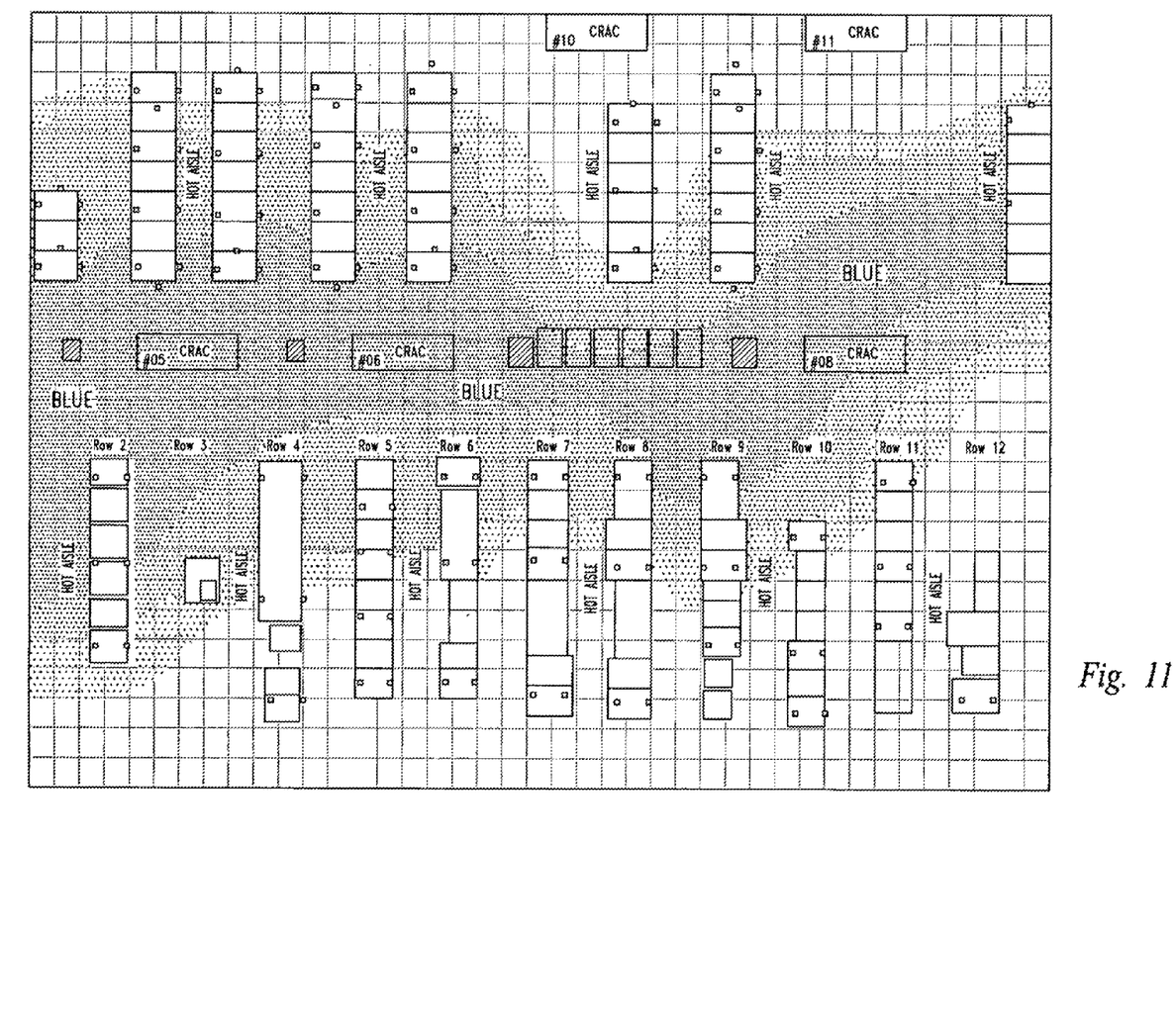
FIG. 11 illustrates an example embodiment of the visualization generated for a sub-floor (plenum) level plane of temperature data for the example data center sensor deployment shown in FIG. 5.

FIG. 11 illustrates an example embodiment of the visualization generated for a sub-floor (plenum) level plane of temperature data for the example data center sensor deployment shown in FIG. 5.

Figure 12:
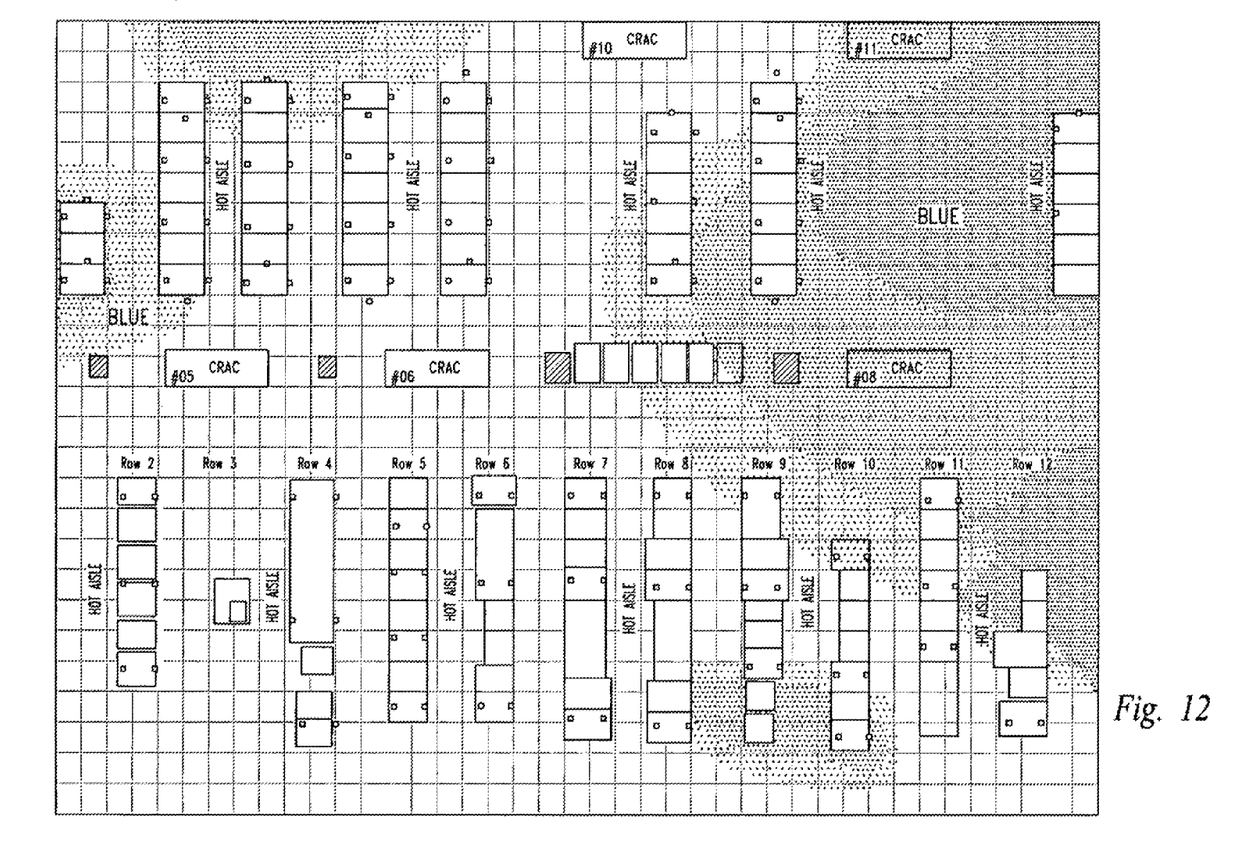
FIG. 12 illustrates an example embodiment of the visualization generated for pressure data for the example data center sensor deployment shown in FIG. 5.

FIG. 12 illustrates an example embodiment of the visualization generated for pressure data for the example data center sensor deployment shown in FIG. 5.

Figure 13:
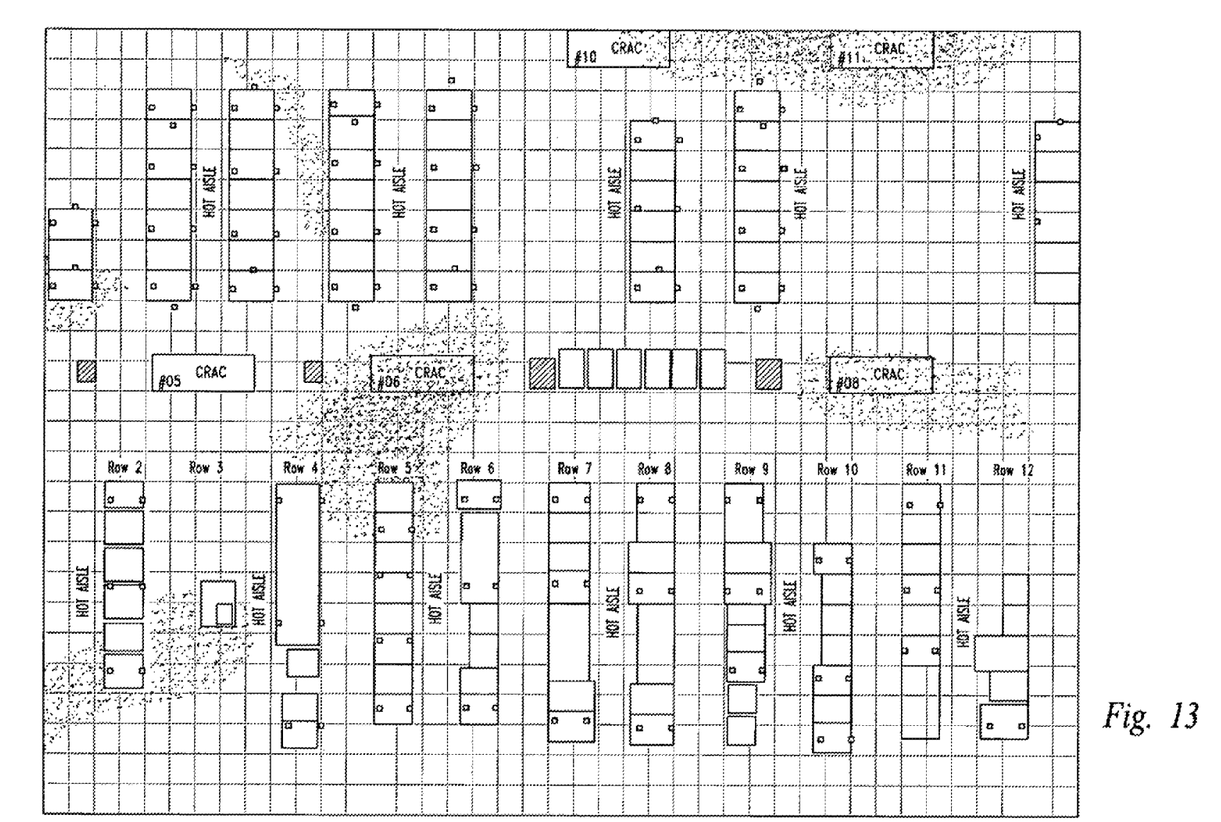
FIG. 13 illustrates an example embodiment of the visualization generated for a top level plane of humidity data for the example data center sensor deployment shown in FIG. 5.

FIG. 13 illustrates an example embodiment of the visualization generated for a top level plane of humidity data for the example data center sensor deployment shown in FIG. 5.

Figure 14:
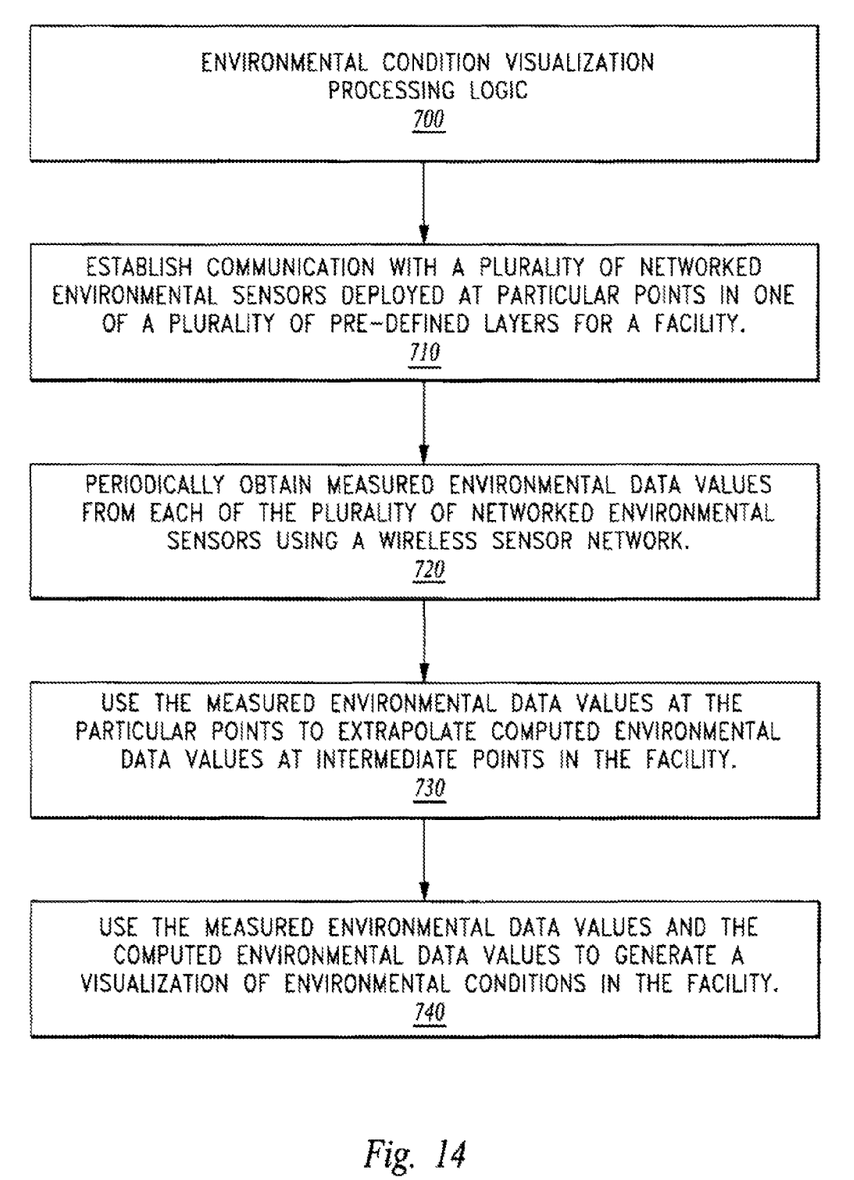
FIG. 14 is a flow diagram illustrating the basic processing flow 700 for a particular embodiment.

FIG. 14 is a flow diagram illustrating the basic processing flow 700 for a particular embodiment. As shown, an example embodiment includes: establishing communication with a plurality of networked environmental sensors deployed at particular points in one of a plurality of pre-defined layers for a facility (processing block 710); periodically obtaining measured environmental data values from each of the plurality of networked environmental sensors using a wireless sensor network (processing block 720); using the measured environmental data values at the particular points to extrapolate computed environmental data values at intermediate points in the facility (processing block 730); and using the measured environmental data values and the computed environmental data values to generate a visualization of environmental conditions in the facility (processing block 740).

Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In example embodiments, a node configured by an application may constitute a "module" that is configured and operates to perform certain operations as described herein. In other embodiments, the "module" may be implemented mechanically or electronically. For example, a module may comprise dedicated circuitry or logic that is permanently configured (e.g., within a special-purpose processor) to perform certain operations. A module may also comprise programmable logic or circuitry (e.g., as encompassed within a general-purpose processor or other programmable processor) that is temporarily configured by software to perform certain operations. It will be appreciated that the decision to implement a module mechanically, in the dedicated and permanently configured circuitry, or in temporarily configured circuitry (e.g., configured by software) may be driven by cost and time considerations. Accordingly, the term "module" should be understood to encompass a functional entity, be that an entity that is physically constructed, permanently configured (e.g., hardwired) or temporarily configured (e.g., programmed) to operate in a certain manner and/or to perform certain operations described herein.

While the machine-readable medium 219 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein. The term "machine-readable medium" shall accordingly be taken to include, but not be limited to, solid-state memories, optical and magnetic media, and carrier wave signals.

As noted, the software and/or related data may be transmitted over a network using a transmission medium. The term "transmission medium" shall be taken to include any medium that is configured to store, encode, or carry instructions for transmission to and execution by the machine, and includes digital or analog communication signals or other intangible media to facilitate transmission and communication of such software and/or data.

The illustrations of embodiments described herein are intended to provide a general understanding of the structure of various embodiments, and they are not intended to serve as a complete description of all the elements and features of components and systems that might make use of the structures described herein. Many other embodiments will be apparent to those of ordinary skill in the art upon reviewing the description provided herein. Other embodiments may be utilized and derived, such that structural and logical substitutions and changes may be made without departing from the scope of this disclosure. The figures herein are merely representational and may not be drawn to scale. Certain proportions thereof may be exaggerated, while others may be minimized. Accordingly, the specification and drawings are to be regarded in an illustrative rather than a restrictive sense.

The description herein may include terms, such as "up", "down", "upper", "lower", "first", "second", etc. that are used for descriptive purposes only and are not to be construed as limiting. The elements, materials, geometries, dimensions, and sequence of operations may all be varied to suit particular applications. Parts of some embodiments may be included in, or substituted for, those of other embodiments. While the foregoing examples of dimensions and ranges are considered typical, the various embodiments are not limited to such dimensions or ranges.

The Abstract is provided to comply with 37 C.F.R. §1.74(b) to allow the reader to quickly ascertain the nature and gist of the technical disclosure. The Abstract is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments have more features than are expressly recited in each claim. Thus the following claims are presented, with each claim standing on its own as a separate embodiment.

Thus, as described above, an apparatus and method for visualizing environmental conditions in a data center using wireless sensor networks is disclosed. Although the disclosed subject matter has been described with reference to several example embodiments, it may be understood that the words that have been used are words of description and illustration, rather than words of limitation. Changes may be made within the purview of the appended claims, as presently stated and as amended, without departing from the scope and spirit of the disclosed subject matter in all its aspects. Although the disclosed subject matter has been described with reference to particular means, materials, and embodiments, the disclosed subject matter is not intended to be limited to the particulars disclosed; rather, the subject matter extends to all functionally equivalent structures, methods, and uses such as are within the scope of the appended claims.

We claim:

1. A method comprising:
    establishing communication with a plurality of networked environmental sensors deployed at sensor points in one of a plurality of pre-defined layers for a facility, each of the plurality of networked environmental sensors being a node in a wireless sensor network and configured to dynamically join the wireless sensor network, automatically discover neighbor nodes, and self-configure communication paths for routing messages between nodes of the wireless sensor-network;
    periodically obtaining measured environmental data values from each of the plurality of networked environmental sensors at the sensor points and routing the measured environmental data values in messages between nodes of the wireless sensor network;
    using the measured environmental data values at the sensor points to interpolate computed environmental data values at intermediate points in the facility, the intermediate points being between the sensor points;
    associating the measured environmental data values and the computed environmental data values with particular visual representations; and
    using the particular visual representations, the measured environmental data values and the computed environmental data values to generate a visualization of environmental conditions in the facility.

2. The method as claimed in claim 1 wherein the measured environmental data values are from the group: humidity values, temperature values, pressure values, power values, electrical current values, airflow values, air quality values, and air particle count values.

3. The method as claimed in claim 1 including routing the measured environmental data values in messages between nodes of the wireless sensor network to a gateway.

4. The method as claimed in claim 1 wherein the plurality of pre-defined layers define a plurality of horizontal planes at differentiated vertical positions in the facility.

5. The method as claimed in claim 1 wherein interpolating computed environmental data values at intermediate points in the facility includes performing a linear interpolation.

6. The method as claimed in claim 1 wherein generating a visualization of environmental conditions in the facility includes generating a colored map of the facility.

7. An article of manufacture comprising a non-transitory machine-readable storage medium having machine executable instruction embedded thereon, which when executed by a machine, cause the machine to:
  establish communication with a plurality of networked environmental sensors deployed at sensor points in one of a plurality of pre-defined layers for a facility, each of the plurality of networked environmental sensors being a node in a wireless sensor network and configured to dynamically join the wireless sensor network, automatically discover neighbor nodes, and self-configure communication paths for routing messages between nodes of the wireless sensor network;
  periodically obtain measured environmental data values from each of the plurality of networked environmental sensors at the sensor points and route the measured environmental data values in messages between nodes of the wireless sensor network;
  use the measured environmental data values at the sensor points to interpolate computed environmental data values at intermediate points in the facility, the intermediate points being between the sensor points;
  associate the measured environmental data values and the computed environmental data values with particular visual representations; and
  use the particular visual representations, the measured environmental data values and the computed environmental data values to generate a visualization of environmental conditions in the facility.

8. The article of manufacture as claimed in claim 7 wherein the measured environmental data values are from the group: humidity values, temperature values, pressure values, power values, electrical current values, airflow values, air quality values, and air particle count values.

9. The article of manufacture as claimed in claim 7 being further configured to route the measured environmental data values in messages between nodes of the wireless sensor network to a gateway.

10. The article of manufacture as claimed in claim 7 wherein the plurality of pre-defined layers define a plurality of horizontal planes at differentiated vertical positions in the facility.

11. The article of manufacture as claimed in claim 7 wherein interpolating computed environmental data values at intermediate points in the facility being further configured to perform a linear interpolation.

12. The article of manufacture as claimed in claim 7 wherein generating a visualization of environmental conditions in the facility being further configured to generate a colored map of the facility.

13. A system comprising:
  a wireless sensor network;
  a visualization generator in data communication via the wireless sensor network; and
  a plurality of networked sensing devices deployed at sensor points in one of a plurality of pre-defined layers for a facility, each of the plurality of networked sensing devices being a node in the wireless sensor network and configured to dynamically join the wireless sensor network, automatically discover neighbor nodes, and self-configure communication paths for routing messages between nodes of the wireless sensor network, the plurality of networked sensing devices in data communication with the visualization generator via the wireless sensor network, each of the plurality of networked sensing devices being configured to periodically communicate to the visualization generator a measured environmental data value at the sensor point by routing the measured environmental data value in a message between nodes of the the wireless sensor network;
  the visualization generator being configured to use the measured environmental data values at the sensor points to interpolate computed environmental data values at intermediate points in the facility, the intermediate points being between the sensor points, to associate the measured environmental data values and the computed environmental data values with particular visual representations, and to use the particular visual representations, the measured environmental data values and the computed environmental data values to generate a visualization of environmental conditions in the facility.

14. The system as claimed in claim 13 wherein the measured environmental data values are from the group: humidity values, temperature values, pressure values, power values, electrical current values, airflow values, air quality values, and air particle count values.

15. The system as claimed in claim 13 being further configured to route the measured environmental data values in messages between nodes of the wireless sensor network to a gateway.

16. The system as claimed in claim 13 wherein the plurality of pre-defined layers define a plurality of horizontal planes at differentiated vertical positions in the facility.

17. The system as claimed in claim 13 wherein the visualization generator being further configured to perform a linear interpolation.

18. The system as claimed in claim 13 wherein the visualization generator being further configured to generate a colored map of the facility.

* * * * *